United States Patent [19]

Henderson et al.

[11] Patent Number: 4,737,747
[45] Date of Patent: Apr. 12, 1988

[54] PRINTED CIRCUIT RESISTIVE ELEMENT

[75] Inventors: James M. Henderson, Scottsdale; Terry L. Gibbs, Tempe, both of Ariz.

[73] Assignee: Motorola, Inc., Schaumburg, Ill.

[21] Appl. No.: 880,987

[22] Filed: Jul. 1, 1986

[51] Int. Cl.[4] .......................... H01P 1/00; H01P 1/26
[52] U.S. Cl. ................................ 333/246; 29/610 R; 338/309; 338/314; 333/128; 333/22 R
[58] Field of Search ................... 333/128, 22 R, 81 A, 333/238, 246; 361/402, 414; 338/216, 309, 314; 29/601, 610 R, 846, 847

[56] References Cited

U.S. PATENT DOCUMENTS

| | | | |
|---|---|---|---|
| 3,354,412 | 11/1967 | Steidlitz | 333/22 R |
| 3,541,474 | 11/1970 | Holton . | |
| 3,585,533 | 6/1971 | Denhard | 333/22 R |
| 3,678,417 | 7/1972 | Ragan . | |
| 4,396,900 | 8/1983 | Hall | 338/309 |
| 4,450,418 | 5/1984 | Yum et al. | 33/128 |
| 4,616,413 | 10/1986 | Iliou et al. | 333/246 X |

OTHER PUBLICATIONS

Design & Process Guide, Ohmega Foil Clad RT/duroid Laminates, Rogers Corp, Microwave Materials Division, pp. 1-13.

Primary Examiner—Paul Gensler
Attorney, Agent, or Firm—Maurice J. Jones, Jr.

[57] ABSTRACT

A resistive element is formed on a printed circuit board using only printed circuit board fabrication techniques. Two printed circuit board strata are laminated together into a multi-layer printed circuit board. A desired trace pattern is etched into a first layer of a first stratum that has first and second conductive metallic layers clad to opposing sides of a first dielectric substrate. A bi-metallic clad substrate having a resistive layer clad to a first side of a second dielectric substrate, a third conductive layer clad to the resistive layer, and a fourth conductive layer clad to a second side of the second dielectric substrate represents the second stratum. The third conductive layer is etched to leave only pads. The resistive layer is etched to form resistive elements of desired resistivity between the pads. When the two strata are laminated together, the pads couple to the trace pattern at desired locations.

9 Claims, 1 Drawing Sheet

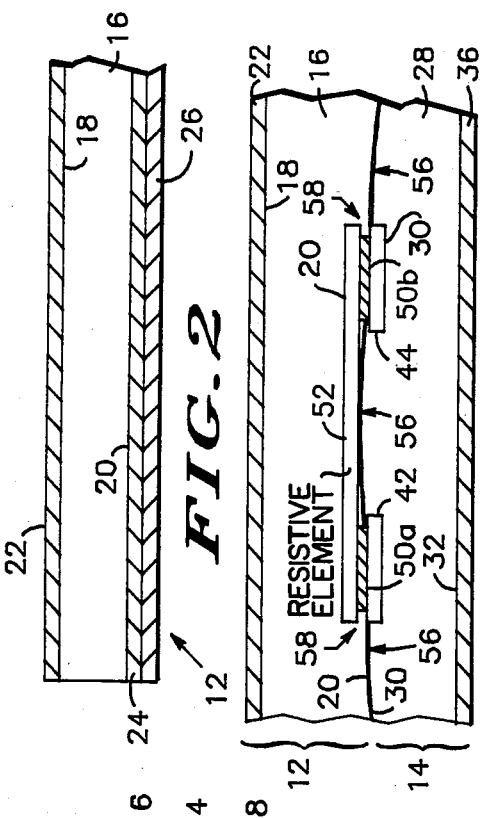
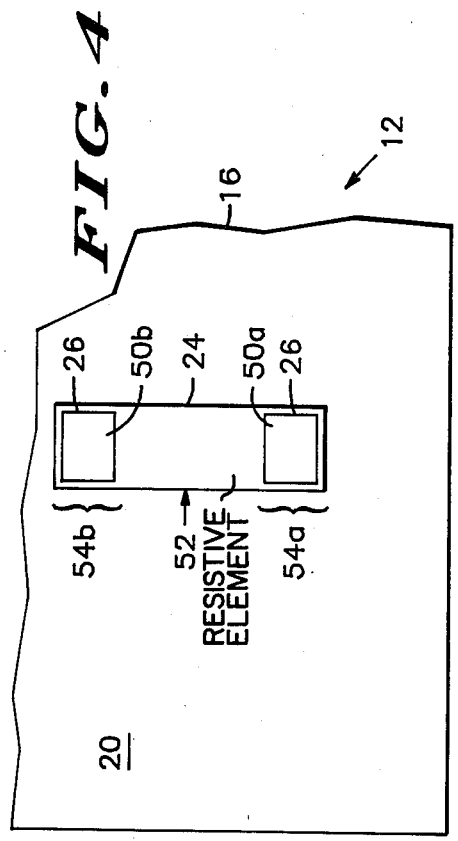
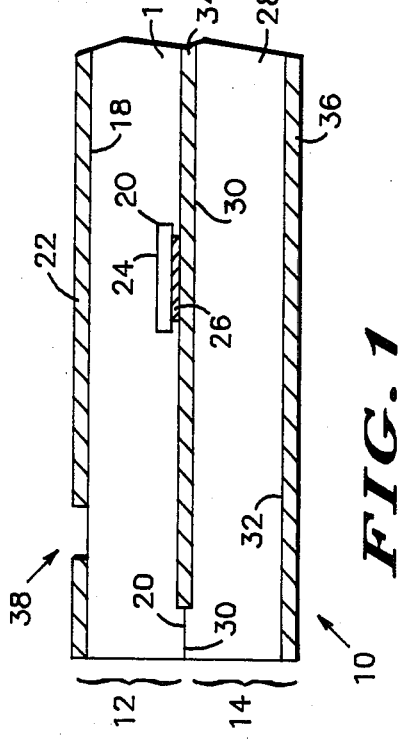
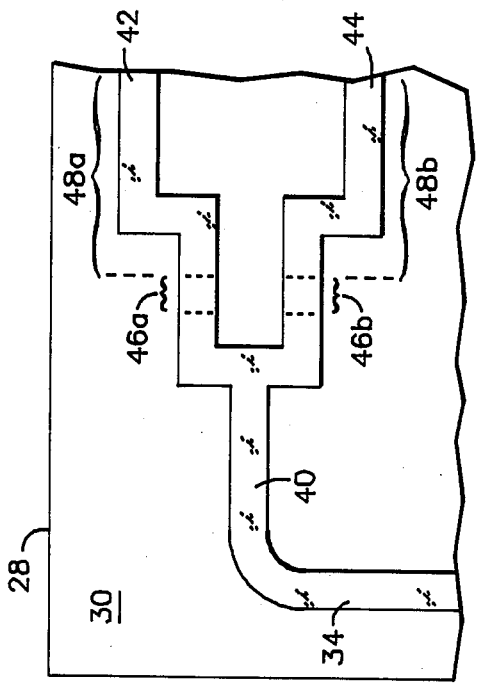

PRINTED CIRCUIT RESISTIVE ELEMENT

STATEMENT OF GOVERNMENT INTEREST

This invention was made with Government support under contract number DAAB07-84-C-J571 awarded by the Army. The Government has certain rights in this invention.

BACKGROUND OF THE INVENTION

This invention relates generally to the transmission of microwave and millimeter-wave energy. Specifically, the present invention relates to an apparatus and method for providing a resistor which is useful in stripline transmission systems. More specifically, the present invention relates to fabricating a resistor on a printed circuit board using only conventional printed circuit board fabrication techniques.

A feed network for an antenna may contain hundreds of power dividers or other multiport devices, each of which requires a resistive element. Several conventional techniques teach constructing or coupling resistive elements in transmission systems. Although these techniques may work acceptably when only a few resistors are needed, they become impractical in large feed networks which require hundreds of these resistors.

For example, chip resistors or resistive films may reside at desired locations in the transmission system. These chip resistors or resistive films must be accurately placed and soldered or bonded to a printed circuit board to properly connect the resistive element to the transmission system. However, even slight displacements, such as 0.005 inch, from an optimum position cause a degraded performance in the transmission system at higher frequencies, such as greater than 10 GHz. Thus, when hundreds of these resistors are placed in a transmission system, the probability of degraded performance from a few misplaced resistors becomes great. Furthermore, the inductance of solder joints and the effects of adhesives often degrade the peformance of the transmission system, and the chip resistors may experience fracturing problems when several layers of printed circuit boards are bonded together to form a multi-layer structure.

Thick film resistors might also reside at desired locations on a printed circuit board. A silk screening operation typically deposits these thick film resistors, and the thick film resistors then cure at elevated temperatures. However, when printed circuit boards become relatively large, the silk screening technique fails to accurately place the resistive film. Additionally, the elevated temperatures used to cure the resistive film may degrade the adhesion of printed circuit traces to a dielectric substrate. Further, the thick film substance, when cured, represented a brittle bump which tends to crack when multiple printed circuit boards are bonded together.

Alternatively, thin film resistors may reside at desired locations of a transmission system. However, the thin film resistors require a hard substrate, such as a ceramic or quartz. Hard substrates are not practical for use with large feed networks because large feed networks require more area than is mechanically obtainable with a hard substrate. Thus, the thin film resistor technique does not adequately work for large feed networks.

A bi-metallic clad substrate may serve as a printed circuit board on which the transmission system is formed. Bi-metallic clad substrates have a thin resistive metallic layer clad to a dielectric substrate and a conductive metallic layer clad to the resistive layer. A conventional use of a bi-metallic clad substrate first removes portions of the conductive metallic layer leaving a desired trace pattern of the feed network. Then, the resistive layer is etched so that resistive material remains clad to the substrate at desired locations. Unfortunately, additional portions of the resistive layer remain sandwiched between the etched conductive metallic traces and the dielectric substrate. This additional portion of the resistive layer causes significant transmission losses at higher frequencies, such as those above 10 GHz.

SUMMARY OF THE INVENTION

Accordingly, it is an object of the present invention to provide an improved resistive element that permits accurate placement of many resistors on a large printed circuit board.

Another object of the present invention concerns providing an improved resistive element that is compatible with the lamination of multiple printed circuit boards together into a multi-layer stripline printed circuit board.

Yet another object of the present invention concerns providing an improved resistive element that minimizes losses at frequencies of greater than 10 GHz.

Still another object of the present invention concerns providing a resistive element that is suitable for use on soft printed circuit boards.

The above and other objects and advantages of the present invention are carried out in one form by a transmission system which includes first and second strata residing in contact with each other. The first strata contains a dielectric substrate with first and second conductive traces clad thereon. The second strata contains a dielectric substrate with a resistive layer clad thereon. The first and second strata are positioned relative to each other so that the resistive layer couples to the first and second conductive traces.

BRIEF DESCRIPTION OF THE DRAWINGS

A more complete presentation of this invention is presented in the detailed description and claims when considered in connection with the accompanying drawings, in which like reference numbers indicate similar parts, and wherein:

FIG. 1 shows a cross-sectional side view of a transmission system built according to the teaching of the present invention;

FIG. 2 shows a side view of a top layer of the transmission system shown in FIG. 1;

FIG. 3 shows a top view of the bottom layer from FIG. 1;

FIG. 4 shows a bottom view of the top layer from FIG. 1; and

FIG. 5 shows a sectional side view of the transmission system shown in FIG. 1 taken perpendicular to the side view of FIG. 1.

DETAILED DESCRIPTION OF THE PREFERRED EMBODIMENT

FIG. 1 shows a transmission system 10 built according to the teaching of the present invention. Transmission system 10 represents a multi-layer printed circuit board which contains strata, or layers, 12 and 14. FIG. 1 shows a portion of a completed transmission system 10. In FIG. 1 each of strata 12 and 14 have been chemically etched and then bonded, or laminated, together using conventional techniques known to those skilled in the art of fabricating printed circuit boards. FIG. 2 shows a sectional side view of stratum 12 prior to the occurrence of etching and bonding processes. Referring to both FIGS. 1 and 2, stratum 12 includes a planar dielectric substrate 16 which has a first substantially planar boundary 18 and a second substantially planar boundary 20. First boundary 18 resides parallel to second boundary 20 and on an opposing side of dielectric 16 from second boundary 20. A conductive layer 22 resides in contact with boundary 18 of stratum 12. In the preferred embodiment conductive layer 22 represents a metallic cladding which attaches to substrate 16 at first boundary 18. Copper may advantageously serve as a suitable metal from which conductive layer 22 is constructed.

Two separate layers of diverse materials attach to dielectric 16 of stratum 12 at second boundary 20. A resistive metallic layer 24 resides immediately adjacent to dielectric 16 at boundary 20. Resistive layer 24 represents a substantially planar surface which adheres at one side thereof to dielectric 16. A conductive layer 26 resides substantially parallel with and adjacent to resistive layer 24 on an opposing side of resistive layer 24 from dielectric 16. It is to be understood that the thickness of resistive and conductive layers illustated in the Figures has been grossly exaggerated for clarity in describing the present invention and are actually very thin in comparison to the thickness of the substrates. Conductive layer 26 represents a metallic conductor, such as copper, which is conventionally used in fabricating printed circuit boards. On the other hand, resistive layer 24 represents a resistive metal, such as nickel-phosphorus, which exhibits a predetermined sheet resistivity value, such as 25 or 100 ohms per square. Accordingly, stratum 12 represents a bi-metallic clad substrate. The bi-metallic cladding resides on boundary 20, and a conventional conductive metallic cladding resides on a boundary 18. Dielectric substrate 16 in this preferred embodiment represents a soft substrate. Omega Foil Clad RT/Duroid manufactured by the Rogers Corporation represents on example of the bi-metallic clad substrate as contemplated by the present invention.

Referring only to FIG. 1, stratum 14 resides adjacent to and substantially parallel with stratum 12. Stratum 14 contains a dielectric substrate 28 which has a first boundary 30 and a second boundary 32. First boundary 30 represents a substantially planar surface which resides in contact with stratum 12. Second boundary 32 represents a substantially planar surface which resides parallel to boundary 30 and on an opposing side of dielectric 28 from boundary 30. A third conductive layer 34 resides substantially parallel with the adjacent to dielectric 28 at boundary 30. In the preferred embodiment conductive layer 34 represents a metallic cladding, such as copper, attached to dielectric 28.

A fourth conductive layer 36 resides substantially parallel with and adjacent to dielectric substrate 28 at boundary 32. In the preferred embodiment conductive layer 36 additionally represents a metallic cladding, such as copper, attached to dielectric 28.

In the preferred embodiment transmission system 10 serves as an antenna having a feed network. First and fourth conductive layers 22 and 36, respectively represent top and bottom ground planes for transmission system 10. Third conductive layer 34 forms conductive traces which serve as center conductors for transmission system 10. Accordingly, electromagnetic energy propagates through transmission system 10 between these ground planes and center conductors. A slot 38 formed in first conductive layer 22 permits electro-magnetic energy to radiate into and from transmission system 10, causing transmission system 10 to operate as an antenna.

FIGS. 3 and 4 described formation of conductive traces and resistive elements on strata 12 and 14 of transmission system 10. FIG. 3 shows third conductive layer 34, which is clad to dielectric 28 of stratum 14, from a view which shows boundary 30 of dielectric 28. Further, FIG. 3 shows particular traces which have been formed in third conductive layer 34 by removing unwanted portions of layer 34. A conventional chemical etching process may advantageously remove the unwanted portions of layer 34 leaving a desired pattern of traces.

The preferred embodiment shown in FIG. 3 represents a Wilkinson power divider. Accordingly, a first conductive trace 40 splits into two separate traces. The two separate traces are labeled trace 42 and trace 44 in FIG. 3. Traces 42 and 44 provide separate channels which are isolated from each other using a resistive element (described below). Trace 42 contains a coupled section 46a and a non-coupled section 48a. Likewise, trace 44 contains a coupled section 46b and a non-coupled section 48b. For optimum performance of the Wilkinson power divider, a resistive element connects with traces 42 and 44 only at sections 46 and not at sections 48. The location of sections 46 may be determined by one skilled in the art. Furthermore, those skilled in the art will recognize that sections 46 represent relatively small, accurately positioned sections of traces 42 and 44. For example, at a frequency of 20 GHz resistors must be placed within a tolerance of approximately ±0.003 inch to optimize performance. Sections 48 are defined so that they represent portions of traces 42 and 44 that do not reside within sections 46.

FIG. 4 shows a view of second boundary 20 of stratum 12 after an etching process has occurred. Two separate etching steps must occur to transform stratum 12 as shown in FIG. 2 into the etched stratum 12 as shown in FIG. 4. First, a conventional etching process removes unwanted portions of conductive layer 26. Only conductive pads 50a and 50b remain after this first step. Pads 50a and 50b reside at locations on stratum 12 that contact sections 46 of traces 42 and 44, respectively (see FIG. 3) when strata 12 and 14 are later bonded together. This first step may simultaeously chemically etch first conductive layer 22 of stratum 12 (see FIG. 1) causing the formation of slot 38.

A second step, performed after the etching of layer 26, removes portions of resistive layer 24 by chemical etching. The chemicals used in etching layer 26 differ from the chemicals used in etching layer 24. Thus, the etching of layer 26 does not remove a significant portion of resistive layer 24, and the etching of resistive layer 24 does not remove a significant portion of the previously etched layer 26.

The portions of resistive layer 26 that remain on boundary 20 of stratum 12 form resistive elements, such as a resistive element 52. Resistive element 52 resides on boundary 20 of stratum 12 between pads 50a and 50b, on one side of resistive element 52, and boundary 20, on an opposing side of resistive element 52. Resistive element 52 contains a first area 54a which contains pad 50a, and a second area 54b which contains pad 50b. Thus, pads 50a and 50b couple together only through resistive element 52. A particular geometry most advantageously used for resistive element 52 depends upon the impedance of traces 42 and 44 (see FIG. 3) and upon the resistivity of resistive layer 24. Those skilled in the art can design a shape for resistive element 52 so that a predetermined resistance exists between pads 50a and 50b.

FIG. 5 shows a sectional side view of transmission system 10 that is taken perpendicular to the FIG. 1 view of transmission system 10. FIGS. 1 and 5 show a bonding or lamination process that occurs after the above-described etching steps. Strata 12 and 14 are positioned relative to each other so that conductive pad 50a contacts trace 42 and so that conductive pad 50b con tacts trace 44. Furthermore, strata 12 and 14 reside at relative positions so that pads 50a and 50b contact only coupled sections 46a and 46b of traces 42 and 44, respectively. Pads 50a and 50b contact resistive element 52. Thus, resistive element 52 electrically couples between traces 42 and 44 of the Wilkinson power divider at coupled sections 46a and 46b. Further, the preset invention exhibits an accuracy in locating resistive element 52 relative to sections 46a and 46b which is obtainable through conventional multi-layer printed circuit board fabrication alignment techniques. Such an accuracy is typically less than ±0.003 inch even on soft substrates having relatively large surface areas.

The bonding, or lamination, process utilizes pressure which may cause the boundaries between strata 12 and 14 to slightly deform away from a perfectly planar surface. But, each of these boundaries nevertheless remains substantially planar. Consequently, traces 42 and 44 tend to contact second boundary 20 of stratum 12, and resistive element 52 tends to contact first boundary 30 of stratum 14.

As shown in FIG. 5, the bonding process additionally utilizes a conventional lamination adhesive 56 typically applied approximately 0.001 inch thick between strata 12 and 14. Thus, the bonding process may permit small gaps to exist between pads 50 of stratum 12 and traces 42 and 44 of stratum 14. In such an event, resistive element 52 tends to remain coupled to traces 42 and 44 through capacitive coupling. In order to improve physical contact between pads 50 of stratum 12 and traces 42 and 44 of stratum 14, lamination adhesive 56 may advantageously be applied so that gaps 58 in the adhesive exist proximate to pads 50. In addition to adhesive gaps 58, traces 42 and 44 and pads 50 may advantageously be plated to increase their thickness and their resistance to chemical contamination.

In summary, a stripline, multi-layer printed circuit board forms transmisson system 10. A bi-metallic clad substrate represents one layer and a conventional double sided substrate represents another layer. Resistive elements are formed using photographic techniques inherent in conventional etching processes known to those skilled in the art of fabricating printed circuit boards. Consequently, the present invention maintains a high degree of accuracy in locating resistive elements on a printed circuit board. Since resistive layers in bi-metallic clad substrates are typically thinner than 50 micro-inches, the resistive layers do not interfere with the lamination of multiple printed circuit boards together into a multi-layer printed circuit board. Finally, the accurate placement of resistive element 52 relative to traces 46a and 46b tends to minimize losses in electro- magnetic energy propagating through transmission system 10.

The foregoing description uses a preferred embodiment to illustrate the present invention. However, those skilled in the art will recognize that changes and modifications may be made in this embodiment without departing from the scope of the present invention. For example, one of ordinary skill in the art will recognize that the particular Wilkinson power divider device which has been used to illustrate the preferred embodiment may be replaced with other multiple port devices which require a resistor connection thereto either for isolation, loading, or termination. In such situations, one or more of conductive traces 42 and 44 may resemble pads rather than traces. Those skilled in the art will recognize that no substantial distinction exists between pads and traces, and that any distinction between pads and tracts made herein is presented merely to ease understanding of the present invention. This and other modifications obvious to those skilled in the art are intended to be included within the scope of this invention.

We claim:

1. A transmission system having a resistive element, the system comprising:
    a first stratum having a first dielectric with first and second conductive traces residing on a first boundary of the first dielectric; and
    a second stratum having a second dielectric with a resistive layer residing on a first boundary of the second dielectric, said second stratum residing in contact with said first stratum so that the first boundary of said second dielectric faces the first boundary of said first dielectric, and the resistive layer couples to the first and second conductive traces.

2. A transmission system as claimed in claim 1 additionally comprising:
    a first conductive pad residing in contact with each of the first conductive trace and the resistive layer; and
    a second conductive pad residing in contact with each of the second conductive trace and the resistive layer.

3. A transmission system as claimed in claim 2 wherein the resistive layer of said second dielectric exhibits a predetermined resistance between said first and second conductive pads, said predetermined resistance corresponding to an impedance parameter of the first and second conductive traces.

4. A transmission system as claimed in claim 2 additionally comprising an adhesive between said first and second strata, said adhesive having first and second gaps therein located proximate to said first and second pads, respectively.

5. A transmission system as claimed in claim 1 wherein:
    said first stratum additionally includes a conductive layer residing on a second boundary of the first dielectric, the second boundary of the first dielectric being substantially parallel to the first boundary of the first dielectric; and
    said second stratum additionally includes a conductive layer residing on a second boundary of the second dielectric, the second boundary of the second dielectric being substantially parallel to the first boundary of the econd dielectric.

6. A method of fabricating a resistor in a printed circuit board having first and second strata, the first stratum having a first conductive layer contacting a first side of a first dielectric substrate, a first side of a resistive layer contacting a second side of the first dielectric substrate, and a second conductive layer contacting a second side of the resistive layer, and the second stratum having a third conductive layer contacting a first side of a second dielectric substrate and a fourth conductive layer contacting a second side of the second dielectric substrate, said method comprising the steps of:

forming first and second traces from the third conductive layer;

forming first and second conductive pads from the second conductive layer; and attaching the first stratum to the second stratum so that the second side of first stratum faces the first side of the second stratum and the first and second conductive pads from said forming step contact the first and second traces, respectively.

7. A method as claimed in claim 6 additionally comprising the step of removing portions resistive layer that do not reside between the first and second conductive pads.

8. A method as claimed in claim 6 wherein said attaching step comprises the step of applying an adhesive layer between the first and second strata so that first and second gaps exist in the adhesive layer, the first and second gaps being located proximate to the first and second conductive pads, respectively.

9. A transmission system having a resistive element, the system comprising:

a first substantially planar conductive layer;

a first dielectric having first and second substantially planar and parallel boundaries, said first conductive layer being clad to said first dielectric at said first dielectric first boundary;

a substantially planar resistive layer having first and second sides, said resistive layer being clad to said first dielectric so that the second side of said first dielectric contacts the first side of said resistive layer;

a second substantially planar conductive layer formed into first and second pads, the first and second pads of said second conductive layer being clad to said resistive layer second side so that a predetermined resistance is exhibited between said first and second pads;

a third substantially planar conductive layer formed into first and second traces, the first trace residing in contact with the first pad and the second trace residing in contact with the second pad;

a second dielectric having first and second substantially planar and parallel boundaries, the first and second traces of said third conductive layer being clad to said second dielectric at said second dielectric first boundary; and a fourth substantially planar conductive layer clad to said second dielectric at said second dielectric second boundary.

* * * * *